United States Patent [19]
Orcutt

[11] Patent Number: 6,109,508
[45] Date of Patent: Aug. 29, 2000

[54] FINE PITCH BONDING METHOD USING RECTANGULAR WIRE AND CAPILLARY BORE

[75] Inventor: John Orcutt, Richardson, Tex.

[73] Assignee: Texas Instruments Incorporated, Dallas, Tex.

[21] Appl. No.: 09/421,015

[22] Filed: Oct. 20, 1999

Related U.S. Application Data

[62] Division of application No. 09/038,408, Mar. 11, 1998, Pat. No. 6,032,850.

[51] Int. Cl.$^7$ .................................................. H01L 21/603
[52] U.S. Cl. ........................................ 228/180.5; 228/49.5
[58] Field of Search .............................. 228/180.5, 110.1, 228/1.1, 4.5, 49.5; 156/73.2; 219/56.21

[56] References Cited

U.S. PATENT DOCUMENTS

| | | | |
|---|---|---|---|
| 3,734,386 | 5/1973 | Hazel ........................................ | 228/4.5 |
| 3,739,467 | 6/1973 | Antier et al. .............................. | 29/604 |
| 4,129,390 | 12/1978 | Bigelow et al. .................... | 400/124.19 |
| 4,506,109 | 3/1985 | Onishi et al. ......................... | 174/125.1 |
| 4,761,520 | 8/1988 | Wade, Jr. et al. .................... | 174/121 R |
| 4,797,095 | 1/1989 | Armstron et al. ........................ | 433/22 |
| 4,803,345 | 2/1989 | Hoshizaki et al. ...................... | 219/553 |
| 5,004,317 | 4/1991 | Jackson et al. ............................ | 385/38 |
| 5,019,746 | 5/1991 | Merg ........................................ | 313/512 |
| 5,056,217 | 10/1991 | Yamazaki et al. ....................... | 29/860 |
| 5,153,981 | 10/1992 | Soto ........................................ | 29/701 |

FOREIGN PATENT DOCUMENTS 354128271A 10/1979 Japan ................................. 228/180.5

*Primary Examiner*—Samuel M. Heinrich
*Attorney, Agent, or Firm*—Wade James Brady, III; Frederick J. Telecky, Jr.

[57] ABSTRACT

A wire of predetermined cross section is provided and fed through a capillary having a bore of predetermined shape and sufficiently larger dimensions so that the wire can be fed through the bore without impediment and without being rotatable within the bore. The capillary is applied to the surface to which the bond is to be made with the smallest cross sectional dimension of the wire disposed between the surface to be bonded and any adjacent wires or bonds in order to minimize the possibility of contact with the adjacent wires or bonds. By utilizing a shaped wire having one narrow dimension and one wide dimension, the space between bond locations required to accommodate the wire can be decreased whereas the total current carrying capacity can be the same as in the case of round wires by having the same cross sectional area as the round wire since the wide dimension is directed away from any adjacent bond locations or the like. In other words, the wire to wire clearance is improved by using the shaped wire. The exterior shape of the capillary is arbitrary and is preferably that of the type having a pair of escalloped opposing regions. The external shape of the capillary is made to accommodate the conditions of the bonding procedure involved. The cross sectional dimension of the capillary in the direction of the narrow cross sectional dimension of the bore and wire can be reduced and still accommodate the shaped wire relative to the round wire.

7 Claims, 1 Drawing Sheet

FINE PITCH BONDING METHOD USING RECTANGULAR WIRE AND CAPILLARY BORE

CROSS REFERENCE TO PRIOR APPLICATION

This application is a division of Ser. No. 09/038,408, filed Mar. 11, 1998, now U.S. Pat. No. 6,032,850.

BACKGROUND OF THE INVENTION

1. Field of the Invention

This invention relates to a capillary, wire and procedure for bonding the wire to a bonding surface, particularly in conjunction with semiconductor devices.

2. Brief Description of the Prior Art

In the fabrication of semiconductor devices, wiring between two bond pads on a chip or between a bond pad on the chip and an external bonding location, such as a lead frame, is generally performed by making a ball bond on one bonding pad at one end of a wire fed from a spool and then making a stitch bond at the other end of the wire. The wire is also severed from the spool from which it has been fed at the stitch bond location. Such bonding and wire severing is generally performed with the aid of a capillary through which the wire to be bonded is passed from the wire spool. The procedure is to form a ball from a portion of the wire which extends out of the capillary, bond the ball to a bond pad and move the capillary to the second bond pad with the wire being fed out through the capillary during travel of the capillary to the second bond pad. The wire is then stitch bonded to the second pad, usually a lead finger, and prepared for severing from the spool, using the nose of the capillary to perform these tasks.

In order for the capillary to perform the function of stitch bonding, the capillary must apply a force against the wire which rests on the bond pad. In order to perform this task without fracture of the capillary, as a first condition, the capillary wall must have sufficient thickness to withstand the forces applied thereto at the location of force application during the stitch bonding procedure. This has been accomplished in the prior art by providing a wire bonding capillary with central bore or aperture, a circular cross section and wall thickness from exterior surface to central bore sufficient to accomplish the above described purpose and withstand the forces thereon.

With the continual decrease in the spacing dimensions between wire bonding locations and the continual decrease in the dimensions of the bond pads, particularly in the semiconductor art, the problem of bonding wire to a wire bonding surface with a capillary and then moving the capillary, with or without wire extending from the bore, to a new location without interference with adjacent wire bonding locations and wires bonded at adjacent wire bonding locations has become more critical. As the dimensions decrease, the possibility that the capillary will interfere with or strike an adjacent bond pad or wire extending from an adjacent bond pad in its travel from one bonding location to a second bonding location increases.

A prior art technique that has been developed to accommodate and/or minimize this problem has utilized a capillary with the diameter of the nose portion decreased. This results in a reduction of capillary wall thickness and provides a poor stitch bond. Accordingly, this technique is undesirable.

A further prior art technique that has been developed to accommodate and/or minimize this problem has utilized a wire bonding capillary of circular cross section with a portion of the capillary wall on a pair of opposing sides of the capillary removed to provide an indentation thereat. Capillaries of this type are provided by Texas Instruments Incorporated under the trademark BowTI™ and are described in U.S. Pat. No. 5,544,804, the contents of which are incorporated herein by reference. This is accomplished by using a capillary having a nose or stitch face somewhat in the shape of a figure "8" with a hollow center to carry the wire as in the prior art and with an enlarged but thin walled waist region. A capillary with this shape is still capable of performing the functions of forming and bonding the ball from the wire passing therethrough at one pad and then stitch bonding the wire at a second pad, using the thicker-walled portion of the "8"-shaped capillary. The top and bottom portions of the "8" must be used to make the stitch bond because they are thicker and better capable of withstanding the forces applied to the capillary during stitch bonding. With a capillary having the above described shape, when bonds are to be made concurrently at adjacent bond location, the adjacent bonds are made with the capillaries rotated by 90° relative to each other so that the circular portion of one capillary fits into but is separated from the waist portion of the adjacent capillary. As is apparent, the bond spacing was able to be materially decreased with the above described technique since the likelihood of contacting adjacent bond pads or wires extending from adjacent bond pads was minimized. After ball bonding one end of the wire extending from the capillary, the capillary with wire therein is moved to the next bonding location during which time the wire is passed through the capillary. The other end of the wire just bonded is then stitch bonded at the next bonding location using the thicker portions of the capillary to make the stitch bond.

However, often, due to the yet smaller dimensions now being introduced and contemplated for the future, the direction of capillary travel from one bonding location to the next bonding location can still be presented with an impediment from the circular portions of the "8"-shape of the Bow-Ti™ embodiment described above. This impediment can again be caused by the wires extending from an adjacent bond location in that the "8"-shaped capillary may strike the adjacent wires when travelling to the next bond location. It is necessary that the capillary not come in contact with the adjacent bond just made or being made or with the wire extending therefrom in order to avoid damage to one of the bonds or wires in question. This is again often a problem due to the increasing proximity of adjacent bonds.

One way to minimize this problem is to further decrease the dimensions of the stitch face of the capillary. However this approach presents the problem of capillary breakage and poor stitch bond strength when forming the stitch bond as discussed above with the prior art. It is therefore apparent that a different solution to this problem is necessary.

SUMMARY OF THE INVENTION

In accordance with the present invention, additional clearance between wires bonded to adjacent bond pads is provided by shaving or decreasing the thickness of the wire in the direction of the adjacent bond pad(s).

Briefly, in accordance with the present invention, a wire and bore combination are provided wherein the shape of the wire and bore are such that the wire is provided with a decreased thickness in the direction of the wires on adjacent bond pads relative to prior art wires used in the same environment and is maintained in that orientation through the bonding procedure by having a wire and capillary bore shape which prevents rotation of the wire within the bore. A preferred example of such an arrangement is a wire having a rectangularly shaped cross section wherein all of the wire surfaces are planar which is fed through a capillary having a rectangularly shaped bore of the same general shape as the wire and having sufficiently larger dimensions so that the wire can be fed through the bore without impediment and also without being rotatable within the bore. The benefit of the rectangular wire is that the distance between opposing flat surfaces is less than would be the diameter of a circular wire of the same cross sectional area. Other shapes which provide the same end result also become readily apparent such as, for example, a wire having one or more flat sides and one or more rounded sides with the capillary bore matching the shape of the wire or having a bore cross section which will not permit the wire to rotate therein if not of similar shape. An example of such a wire is one with a pair of opposing flat surfaces with a pair of opposing rounded surfaces therebetween. The capillary is applied to the surface to which the bond is to be made with the smaller cross sectional dimension of the rectangle disposed between the surface to be bonded and any adjacent wires or bonds in order to minimize the possibility of contact with the adjacent wires or bonds. It is understood that in the event the rectangle is a square, either cross sectional dimension can be used. It can be appreciated that, by utilizing a wire and capillary combination of the type described above, the space between bond locations required to accommodate the wire can be decreased and/or the likelihood of contacting an adjacent bond pad or wire extending from an adjacent bond pad is minimized whereas the total current carrying capacity of the wire can be the same as in the case of round wires by having the same cross sectional area as the round wire. In other words, the wire to wire clearance is improved by using the wire of the present invention when bonded in accordance with the capillary and procedure of the present invention. The exterior shape of the capillary is arbitrary and determined by requirements of the operation being conducted. This shape is preferably with the walls that do not perform a bonding function being thin or escalloped such as that of the above described Bow-Ti™ variety having a pair of escalloped opposing regions. Clearly, the external shape of the capillary will be made to accommodate to conditions of the bonding procedure involved. It can be seen that the cross sectional dimension of the capillary in the direction of the narrow cross sectional dimension of the bore and wire can be reduced and still accommodate the shaped wire relative to the dimensions required to accommodate the round wire.

DESCRIPTION OF THE PREFERRED EMBODIMENT

Figure 1:
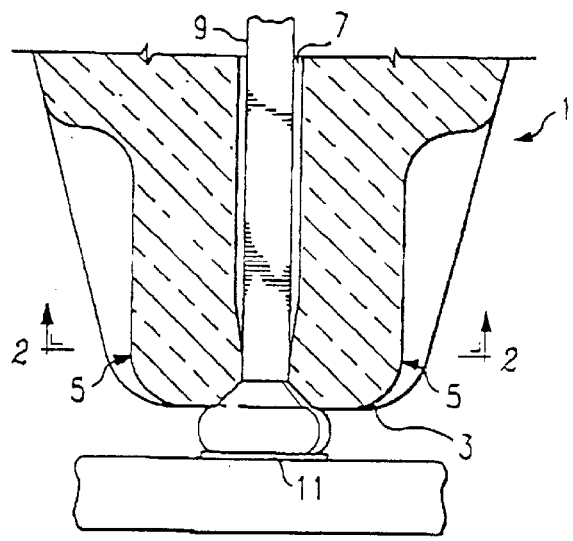
FIG. 1 is a cross sectional view of a capillary in accordance with the present invention.
Figure 2:
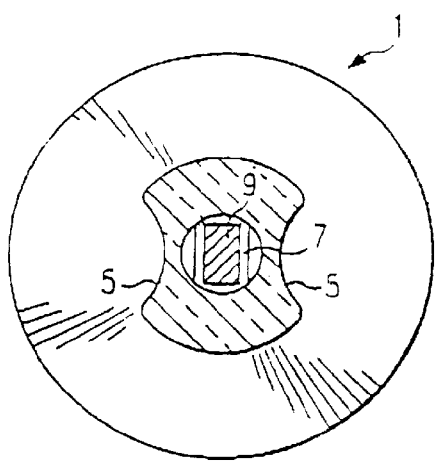
FIG. 2 is a cross sectional view taken along the line 2—2 of FIG. 1.

Referring first to FIGS. 1 and 2, there is shown a capillary 1 having a nose portion 3 of reduced cross section with escalloped opposed regions 5. A wire 9 of rectangular cross section extends through the bore 7 of the capillary 1, the bore having a rectangular cross section and being dimensioned to prevent the wire from rotating within the bore. Generally, the bore 7 is of the same shape as the wire 9 with dimensions sufficiently larger than the wire to permit unimpeded travel of the wire through the bore. There is also shown a ball bond 11 of the wire on a bond pad 13 of a semiconductor device.

Figure 3:
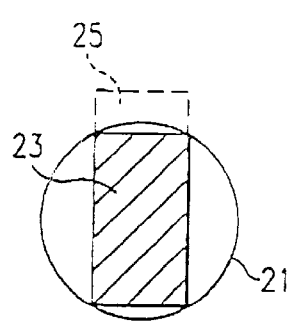
FIG. 3 is a schematic diagram showing the difference in dimensions between a round wire, a rectangular wire having the same diagonal dimension as the round wire and a rectangular wire having the same cross sectional area as the round wire.

Referring to FIG. 3, there is shown a typical circular wire 21 which is the type used in accordance with the prior art. The typical rectangular wire that is used in accordance with the present invention is a rectangularly shaped wire 23 having a diagonal dimension the same as the diameter of the circular wire. It is readily apparent that the rectangular wire 23 has a smaller lateral dimension than does the circular wire 21, however it will have less current carrying capacity due to the reduced cross sectional area of the rectangular wire 23. As can be seen in phantom, the height dimension of the wire 23 can be enlarged with the region 25 to provide increased cross sectional area to the wire. It can be seen that the lateral dimension is unaltered by the addition of the region 25, thereby providing the same advantages as found with the wire 23 in that the bond pads can now be placed closer together for bonding. The dimension of the capillary across the escalloped regions 5 can now be reduced and still accommodate the wire 9 within the bore 7 with the same wall thickness as provided in the case of the round wire.

Figure 5:
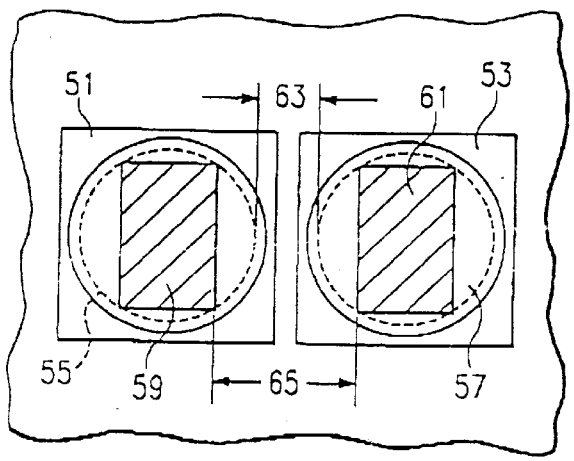
FIG. 5 is a schematic diagram showing the difference in clearance between wires using a round wire as opposed to a rectangular wire.
Figure 4:
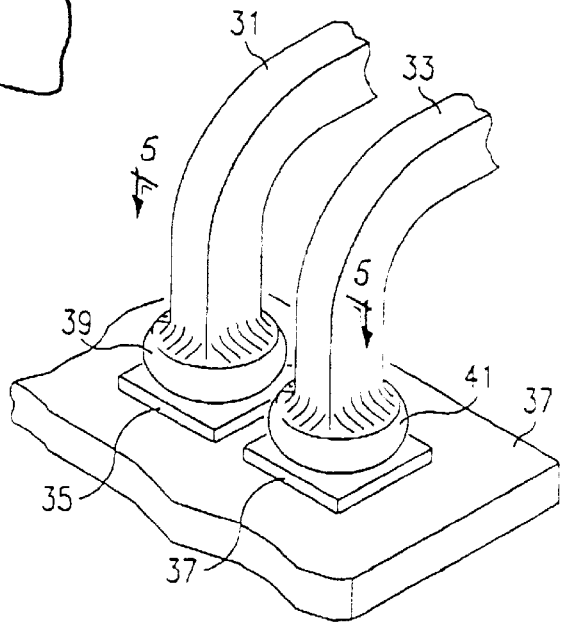
FIG. 4 is a perspective view showing bond pads and adjacent bonded wires using the rectangular wire.

Referring now to FIG. 4, there is shown a pair of rectangular wires 31, 33 bonded to bond pads 35, 37 via bonds 39,41. The improved wire clearance is provided due to the reduced lateral dimension of each of the wires 31,33, resulting in the bonds being positionable closer together than in the prior art. This is borne out with reference to FIG. 5 which shows bond pads 51, 53 on which are schematically shown a round wire 55,57 and a rectangular wire 59,61. It can be seen that the clearance between the rectangular wires 65 is much greater than between the circular wires 63.

In operation, the wire 9 is fed through the bore 7 of the capillary 1 and the capillary is oriented so that so that the narrow dimension of the rectangular wire is disposed in the direction of the closest adjacent bond region. The bond is then made to provide a bond of the type shown in FIG. 4.

Though the invention has been described with reference to a specific preferred embodiment thereof, many variations and modifications will immediately become apparent to those skilled in the art. It is therefore the intention that the appended claims be interpreted as broadly as possible in view of the prior art to include all such variations and modifications.

What is claimed is:

1. A method of forming a wire bond comprising the steps of:

(a) providing a capillary having an exterior surface, a nose region at a terminal portion of said capillary and a bore therethrough, said bore having a predetermined cross section extending at least through said nose region and terminating at the end portion of said capillary and a wall disposed between and defined by said bore and said exterior surface;

(b) disposing a wire in said bore and having geometry relative to the geometry of said bore to prevent rotation of said wire within said portion of said bore having predetermined cross section;

(c) orienting said capillary in a predetermined position relative to a regions to which a bond is to be made; and (d) forming a bond to said region with said wire while said capillary is oriented in said predetermined position.

2. The method of claim 1 wherein said wire has a largest dimension in a first direction and a smaller dimension in a direction normal to said first direction, said capillary being oriented so that said smaller dimension is in the direction of a wire bond location adjacent said bond.

3. The method of claim 2 wherein said cross section includes at least one planar surface.

4. The method of claim 2 wherein said cross section includes a pair of opposing planar surfaces.

5. The method of claim 2 wherein said cross section includes a rounded surface.

6. The method of claim 2 wherein said wire further includes a pair of rounded surfaces.

7. The method of claim 2 wherein said wire further includes a second pair of opposed planar surfaces.

* * * * *